US009916879B2

(12) United States Patent
Song

(10) Patent No.: US 9,916,879 B2
(45) Date of Patent: Mar. 13, 2018

(54) SEMICONDUCTOR MEMORY DEVICE AND I/O CONTROL CIRCUIT THEREFOR

(71) Applicant: SK hynix Inc., Icheon-si, Gyeonggi-do (KR)

(72) Inventor: Choung Ki Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 25 days.

(21) Appl. No.: 15/282,402

(22) Filed: Sep. 30, 2016

(65) Prior Publication Data

US 2017/0018294 A1    Jan. 19, 2017

Related U.S. Application Data

(62) Division of application No. 14/195,572, filed on Mar. 3, 2014, now Pat. No. 9,483,430.

(30) Foreign Application Priority Data

Nov. 29, 2013    (KR) .................. 10-2013-0147085

(51) Int. Cl.
| | |
|---|---|
| *G06F 13/00* | (2006.01) |
| *G06F 3/00* | (2006.01) |
| *G11C 7/10* | (2006.01) |
| *G06F 13/38* | (2006.01) |
| *G06F 13/16* | (2006.01) |
| *G11C 7/22* | (2006.01) |

(52) U.S. Cl.
CPC ........ *G11C 7/1051* (2013.01); *G06F 13/1668* (2013.01); *G06F 13/385* (2013.01); *G11C 7/1078* (2013.01); *G11C 7/22* (2013.01)

(58) Field of Classification Search
None
See application file for complete search history.

(56) References Cited

U.S. PATENT DOCUMENTS

| | | | |
|---|---|---|---|
| 2006/0158214 A1 | 7/2006 | Janzen et al. | |
| 2012/0051159 A1 | 3/2012 | Lee | |
| 2013/0339641 A1* | 12/2013 | Ok | ..................... G06F 12/0646 711/158 |

FOREIGN PATENT DOCUMENTS

| | | |
|---|---|---|
| CN | 101849262 A | 9/2010 |
| CN | 102142270 A | 8/2011 |

* cited by examiner

*Primary Examiner* — David E Martinez
(74) *Attorney, Agent, or Firm* — William Park & Associates Ltd.

(57) ABSTRACT

An I/O control circuit, includes a mode setting unit configured to generate a first mode signal, a second mode signal, a third mode signal, and a fourth mode signal in accordance with one of a plurality of I/O option modes, a first control signal generation unit configured to generate a first mode determination signal and a first control signal enable signal in response to the first I/O option signal and the first mode signal, and a second control signal generation unit configured to generate a second control signal enable signal, a third control signal enable signal, and a fourth control signal enable signal in response to a second I/O option signal, the first mode determination signal, the second mode signal, the third mode signal, and the fourth mode signal.

11 Claims, 7 Drawing Sheets

311

312

SEMICONDUCTOR MEMORY DEVICE AND I/O CONTROL CIRCUIT THEREFOR

CROSS-REFERENCE TO RELATED APPLICATION

The present application is a divisional application of U.S. application Ser. No. 14/195,572, filed on Mar. 3, 2014, and the present application claims priority under 35 U.S.C. § 119(a) to Korean application number 10-2013-0147085, filed on Nov. 29, 2013, in the Korean Intellectual Property Office, which is incorporated herein by reference in its entirety.

BACKGROUND

1. Technical Field

Various embodiments relate to a semiconductor integrated device, and more particularly, to a semiconductor memory device and an I/O control circuit.

2. Related Art

A semiconductor memory device can typically be placed in one of a number of different input/output (I/O) option modes, where each I/O option mode supports an associated data I/O bandwidth. The data I/O bandwidth defines the amount of data that can be inputted in response to a write command and/or outputted in response to a read command. Examples of I/O option modes may include a X4 I/O option mode, a X8 I/O option mode, and a X16 I/O option mode.

When the semiconductor memory device is placed in a specific I/O option mode, one or more different control functions that are associated with that I/O option mode are enabled. Examples of such control functions include, but are not limited to, a data masking control function (WDM), a data bus inversion control function (DBI), and a termination data strobe control function (TDQS). There are two types of DBI control functions: a write DBI control function (WDBI) function and a read DBI control function (RDBI).

In some cases, when a semiconductor memory device operates in a particular I/O option mode, a control function that is not associated with that I/O option mode may be inadvertently enabled in error.

SUMMARY

In an embodiment, an I/O control circuit may include a mode setting unit configured to generate a first mode signal, a second mode signal, a third mode signal, and a fourth mode signal in accordance with one of a plurality of I/O option modes, a first control signal generation unit configured to generate a first mode determination signal and a first control signal enable signal in response to the first I/O option signal and the first mode signal, and a second control signal generation unit configured to generate a second control signal enable signal, a third control signal enable signal, and a fourth control signal enable signal in response to a second I/O option signal, the first mode determination signal, the second mode signal, the third mode signal, and the fourth mode signal.

In an embodiment, a semiconductor memory device may include a mode control unit configured to generate an output signal in response to a first control signal enable signal, a second control signal enable signal, a third control signal enable signal, a fourth control signal enable signal, and a buffer enable signal received from an I/O control circuit, a pad unit configured to include an I/O mode control pad, a data I/O pad, and a data I/O strobe pad, an input driving unit driven in response to the output signal of the mode control unit and electrically coupled to the pad unit, an output driving unit driven in response to the output signal of the mode control unit and electrically coupled to the pad unit, and an I/O conversion unit configured to provide a memory region with data received from the input driving unit and provide the output driving unit with data received from the memory region in response to the fourth control signal enable signal.

In an embodiment, a semiconductor memory device may include a first mode control unit configured to generate an output signal in response to a first control signal enable signal, a second control signal enable signal, a third control signal enable signal, a fourth control signal enable signal, a buffer enable signal, a first I/O option signal, and a second I/O option signal received from the I/O control circuit, a pad unit configured to include an I/O mode control pad, a data I/O pad, and a data I/O strobe pad, an input driving unit driven in response to the output signal of the first mode control unit and electrically coupled to the pad unit, an output driving unit driven in response to the output signal of the first mode control unit and electrically coupled to the pad unit, and an I/O conversion unit configured to provide a memory region with data received from the input driving unit and provide the output driving unit with data received from the memory region in response to a fourth control signal enable signal.

In an embodiment, a system includes a memory controller including an I/O control circuit and a semiconductor memory device. The I/O control circuit may include a mode setting unit configured to generate a first mode signal, a second mode signal, a third mode signal, and a fourth mode signal in accordance with one of a plurality of I/O option modes, a first control signal generation unit configured to generate a first mode determination signal and a first control signal enable signal in response to the first I/O option signal and the first mode signal, and a second control signal generation unit configured to generate a second control signal enable signal, a third control signal enable signal, and a fourth control signal enable signal in response to a second I/O option signal, the first mode determination signal, the second mode signal, the third mode signal, and the fourth mode signal. The semiconductor memory device may include a mode control unit configured to generate an output signal in response to a first control signal enable signal, a second control signal enable signal, a third control signal enable signal, a fourth control signal enable signal, and a buffer enable signal received from an I/O control circuit, a pad unit configured to include an I/O mode control pad, a data I/O pad, and a data I/O strobe pad, an input driving unit driven in response to the output signal of the mode control unit and electrically coupled to the pad unit, an output driving unit driven in response to the output signal of the mode control unit and electrically coupled to the pad unit, and an I/O conversion unit configured to provide a memory region with data received from the input driving unit and provide the output driving unit with data received from the memory region in response to the fourth control signal enable signal.

DETAILED DESCRIPTION

Figure 1:
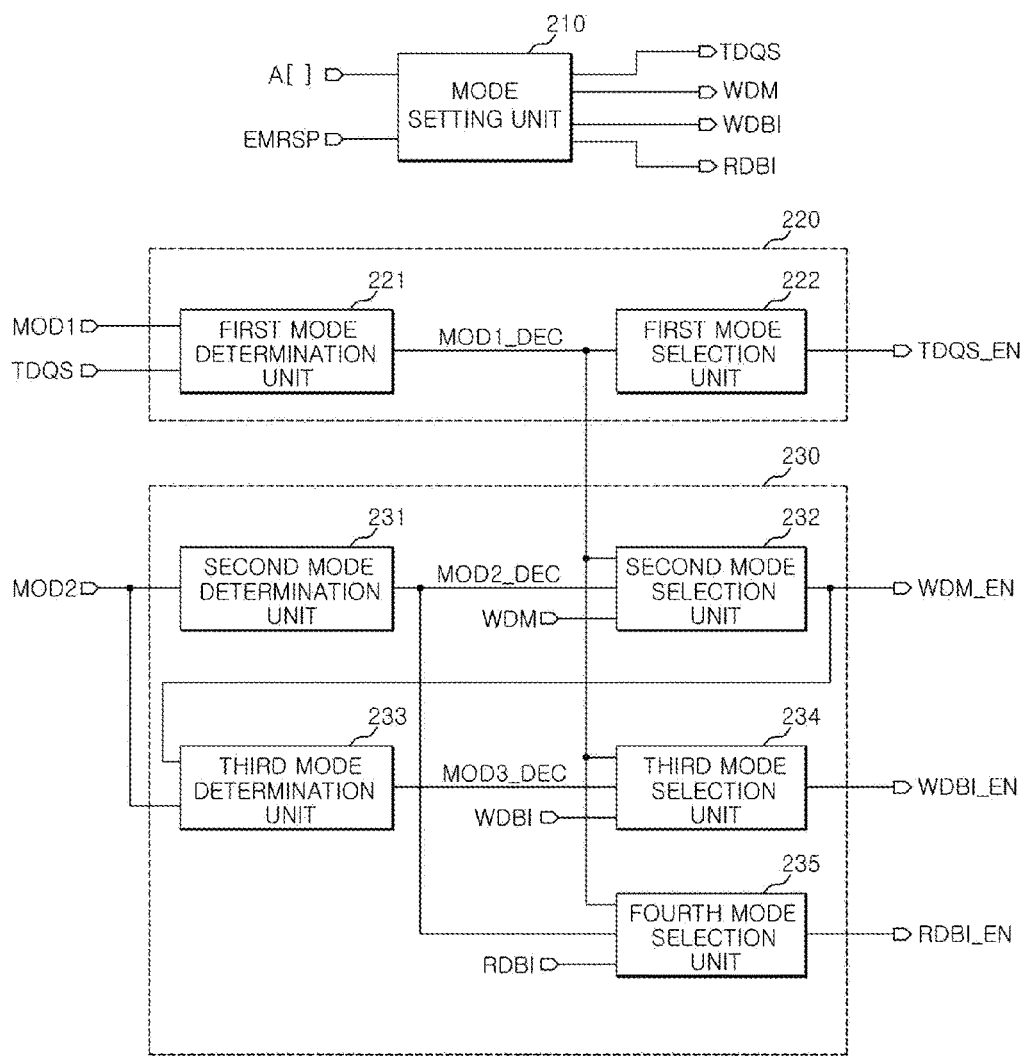
FIG. 1 is a diagram illustrating an embodiment of an I/O control circuit of a semiconductor memory device.

Various embodiments of a semiconductor memory device and of an I/O control circuit will be described below with reference to the accompanying drawings. In an embodiment, a I/O control circuit may be used to place a semiconductor memory device in one of a number of different I/O option modes. Each I/O option mode supports an associated data I/O bandwidth. Examples of such I/O option modes include, but are not limited to, a X4 I/O option mode, a X8 I/O option mode and a X16 I/O option mode. In an embodiment, the I/O control circuit in disposed in a memory controller. In an embodiment, the I/O control circuit is disposed in a semiconductor memory device.

Each of the I/O option modes supports one or more different control functions in accordance with a control function priority scheme. Examples of such control functions include, but are not limited to, a data masking control function (also referred to as a WDM control function), a data bus inversion control function (also referred to as a DBI control function) and a termination data strobe control function (also referred to as a DBI control function). There are two types of DBI control functions: a write DBI control function (also referred to as a WDBI control function) and a read DBI control function (also referred to as a RDBI control function).

Table 1 details an example of a relationship between the different I/O option modes and the control functions. More specifically, Table 1 shows the control functions supported by each of the X4, X8 and X16 I/O option modes

TABLE 1

|     | TDQS | WDM | WDBI | RDBI |
| --- | --- | --- | --- | --- |
| X4  | Not supported | Not supported | Not supported | Not supported |
| X8  | Supported | Supported | Supported | Supported |
| X16 | Not supported | Supported | Supported | Supported |

When the semiconductor memory device is placed in the X4 I/O option mode, the TDQS control function, the WDM control function, the WDBI control function and the RDBI control function are not supported. When the semiconductor memory device is placed in the X8 I/O option mode, the TDQS control function, the WDM control function, the WDBI control function and the RDBI control function are all supported. When the semiconductor memory device is placed in the X16 I/O option mode, the TDQS control function is not supported while the WDM control function, the WDBI control function and the RDBI control function are supported.

The TDQS function is only supported in the X8 I/O option mode. The DBI control functions (i.e. the WDBI control function and the RDBI control function) are only supported in the X8 I/O option mode and the X16 I/O option mode.

Table 2 details the priorities for the different I/O control functions.

TABLE 2

| TDQS | WDM | WDBI | RDBI | Operation |
| --- | --- | --- | --- | --- |
| Enable | Don't care | Don't care | Don't care | TDQS |
| Disable | Enable | Don't care | Enable | WDM, RDBI |
|  |  |  | Disable | WDM |
|  | Disable | Enable | Enable | WDBI, RDBI |
|  |  |  | Disable | WDBI |
|  |  | Disable | Enable | RDBI |
|  |  |  | Disable | — |

Based on the priority scheme detailed in Table 2, the WDM control function, the WDBI control function, and the RDBI control function are disabled when the TDQS function is enabled. When the WDM control function is enabled, the RDBI control function may be enabled. At least one of the WDBI control function and the RDBI control function may be supported without the WDM function depending on whether the WDM function is enabled or not when the TDQS function is disabled.

FIG. 1 is a diagram illustrating an embodiment of an I/O control circuit 200 of a semiconductor memory device.

The I/O control circuit 200 may include a mode setting unit 210, a first control signal generation unit 220, and a second control signal generation unit 230.

The mode setting unit 210 generates a first mode signal TDQS, a second mode signal WDM, a third mode signal WDBI and a fourth mode signal RDBI in response to an address signal A[ ] and a mode setting strobe signal EMRSP. In an embodiment, the first, second, third and fourth mode signals TDQS, WDM, WDBI, RDBI may be generated by a mode register set in accordance with an I/O option mode.

The first control signal generation unit 220 generates a first mode determination signal MOD1_DEC and a first control signal enable signal TDQS_EN in response to a first I/O option signal MOD1 and a first mode signal TDQS The first control signal generation unit 220 may include a first mode determination unit 221 and a first mode selection unit 222.

The first mode determination unit 221 generates the first mode determination signal MOD1_DEC in response to the first I/O option signal MOD1 and the first mode signal TDQS. The first mode selection unit 222 generates the first control signal enable signal TDQS_EN in response to the first mode determination signal MOD1_DEC. The first mode selection unit 222 activates the first control signal enable signal TDQS_EN when the first I/O option signal MOD1 is enabled.

The second control signal generation unit 230 generates a second control signal enable signal WDM_EN, a third control signal enable signal WDBI_EN, and a fourth control signal enable signal RDBI_EN in response to a second I/O option signal MOD2, the first mode determination signal MOD1_DEC, and the second, third and fourth mode signals WDM, WDBI, RDBI. The first mode determination signal MOD1_DEC is received at the second control signal generation unit 230 from the first control signal generation unit 220.

The second control signal generation unit 230 may include a second mode determination unit 231, a second mode selection unit 232, a third mode determination unit 233, a third mode selection unit 234, and a fourth mode selection unit 235.

The second mode determination unit 231 generates a second mode determination signal MOD2_DEC in response to the second I/O option signal MOD2.

The second mode selection unit 232 generates the second control signal enable signal WDM_EN in response to the first mode determination signal MOD1_DEC, the second mode determination signal MOD2_DEC, and the second mode signal WDM. The second mode selection unit 232 disables the second control enable signal WDM_EN when the second I/O option signal MOD2 is enabled.

The third mode determination unit 233 generates a third mode determination signal MOD3_DEC in response to the second I/O option signal MOD2 and the second control signal enable signal WDM_EN.

The third mode selection unit 234 generates the third control signal enable signal WDBI_EN in response to the first mode determination signal MOD1_DEC, the third mode determination signal MOD3_DEC, and the third mode signal WDBI. The third mode selection unit 234 disables the third control signal enable signal WDBI_EN when the second I/O option signal MOD2 is enabled. The third mode selection unit 234 activates the third control signal enable signal WDBI_EN based on the activation state of the second control signal enable signal WDM_EN when the second I/O option signal MOD2 is disabled and the activation state of the first control signal enable signal TDQS_EN when the first I/O option signal MOD1 is enabled.

The fourth mode selection unit 235 generates the fourth control signal enable signal RDBI_EN in response to the first mode determination signal MOD1_DEC, the second mode determination signal MOD2_DEC, and the fourth mode signal RDBI. The fourth mode selection unit 235 disables the fourth control signal enable signal RDBI_EN when the second I/O option signal MOD2 is enabled. The fourth mode selection unit 235 activates the fourth control signal enable signal RDBI_EN based on the activation state of the first control signal enable signal TDQS_EN when the first I/O option signal MOD1 is enabled.

The first I/O option signal MOD1 may be a signal that places the semiconductor memory device in the X8 I/O option mode. The second I/O option signal MOD2 may be a signal that places the semiconductor memory device in the X4 I/O option mode.

The first mode signal TDQS is a signal that determines whether the semiconductor memory device will support a TDQS control function. The second mode signal WDM is a signal that determines whether the semiconductor memory device will perform the data masking control function WDM when a write operation is performed. The third mode signal WDBI is a signal that enables the semiconductor memory device to perform the data inversion/non-inversion control function WDBI when a write operation is performed. The fourth mode signal RDBI is a signal that enables the semiconductor memory device to perform the data inversion/non-inversion control function RDBI when a read operation is performed.

The priority order of the control functions performed by the semiconductor memory device is assigned as follows: TDQS control function, WDM control function, WDBI control function, and RDBI control function. The TDQS control function is supported in the first I/O option mode. The first I/O option mode is the X8 I/O option mode. The TDQS control function is not supported in the X4 I/O option mode and the X16 I/O option mode. Accordingly, the first control signal generation unit 220 generates the first control signal enable signal TDQS_EN in response to the first I/O option signal MOD1. The generation of the first control signal enable signal TDQS_EN does not depend on the other mode signals WDM, WDBI, and RDBI.

The WDM, WDBI, and RDBI control functions are selectively activated when the TDQS control function is deactivated. The WDM, WDBI, and RDBI control functions are not supported in the second I/O option mode. The second I/O option mode is the X4 I/O option mode. The WDM, WDBI, and RDBI control functions are supported in the X8 I/O option mode and in the X16 I/O option mode. The RDBI control function may be supported when the WDM control function is activated. The WDBI control function may be supported when the WDM control function is deactivated. The RDBI control function may be supported when the WDM control function is deactivated. Both the WDBI control function and the RDBI control function may be supported when the WDM control function is deactivated.

The activation of the second control signal enable signal WDM_EN is based on the second I/O option signal MOD2 and the first control signal enable signal TDQS_EN.

The activation of the third control signal enable signal WDBI_EN is based on the second I/O option signal MOD2 and the second control signal enable signal WDM_EN.

The activation of the fourth control signal enable signal RDBI_EN is based on the second I/O option signal MOD2 and the second control signal enable signal WDM_EN.

Figure 2:
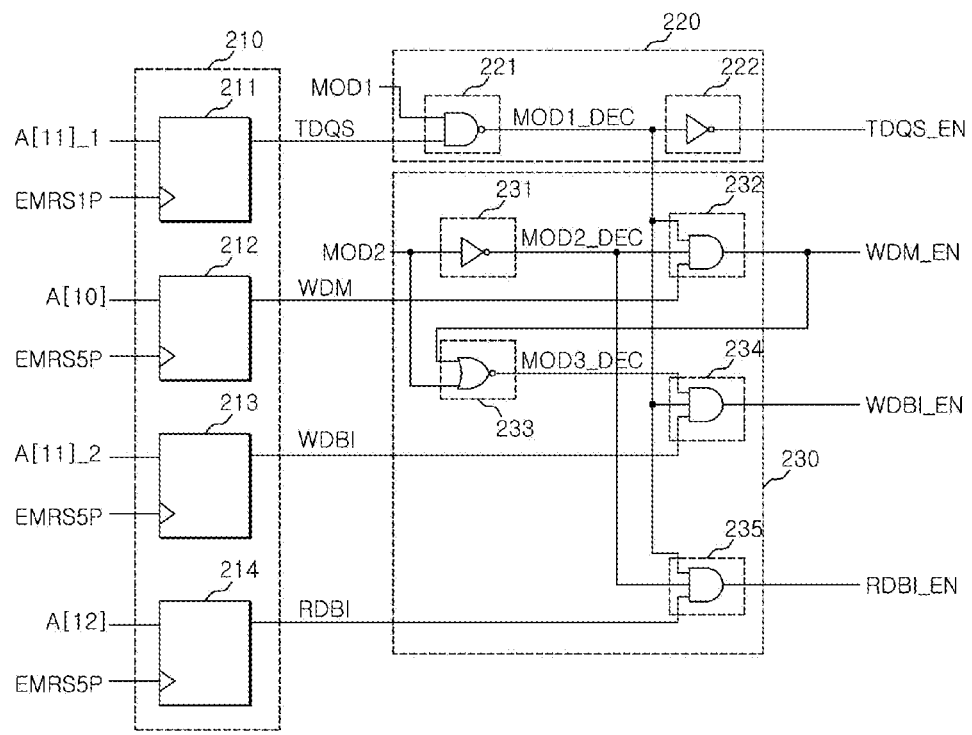
FIG. 2 is a diagram of the I/O control circuit shown in FIG. 1.

FIG. 2 is a diagram of an example of the I/O control circuit shown in FIG. 1.

An embodiment of the I/O control circuit 200-1 may include a mode setting unit 210, a first control signal generation unit 220, and a second control signal generation unit 230.

The mode setting unit 210 may include a first mode setting circuit 211, a second mode setting circuit 212, a third mode setting circuit 213 and a fourth mode setting circuit 214.

The first mode setting circuit 211 generates a first mode signal TDQS in response to a first address signal A[11]_1 and a first mode setting strobe signal EMRS1P. The second mode setting circuit 212 generates a second mode signal WDM in response to a second address signal A[10] and a second mode setting strobe signal EMRS5P. The third mode setting circuit 213 generates a third mode signal WDBI in response to a third address signal A[11]_2 and the second mode setting strobe signal EMRS5P. The fourth mode setting circuit 214 generates a fourth mode signal RDBI in response to a fourth address signal A[12] and the second mode setting strobe signal EMRS5P.

The first address signal A[11]_1 is an address signal of a first mode register that provides the first mode setting strobe signal EMRS1P. The second, third and fourth address signals A[10], A[11]_2, A[12] are address signals of a second mode register that provides the second mode setting strobe signal EMRS5P.

The first control signal generation unit 220 includes a first mode determination unit 221 and a first mode selection unit 222. The first mode determination unit 221 receives a first I/O option signal MOD1 and the first mode signal TDQS as inputs. If the first I/O option signal MOD1 is low and the first mode signal TDQS is low, the first mode determination unit 221 responsively generates a high first mode determination signal MOD1_DEC. The first mode selection unit 222 receives the first mode determination signal MOD1_DEC as an input and generates an inverse of the received first mode determination signal MOD1_DEC as the first control signal enable signal TDQS_EN. When the first I/O option signal MOD1 indicates that the semiconductor memory device in the X8 I/O option mode the first mode signal TDQS is enabled and the TDQS control function is supported.

The second control signal generation unit 230 includes a second mode determination unit 231 and a second mode selection unit 232. The second mode determination unit 231 receives a second I/O option signal MOD2 as an input and generates an inverse of the second I/O option signal MOD2 as a second mode determination signal MOD2_DEC. The second mode selection unit 232 receives the first mode determination signal MOD1_DEC, the second mode determination signal MOD2_DEC, and the second mode signal WDM as inputs. If the first mode determination signal MOD1_DEC, the second mode determination signal MOD2_DEC, and the second mode signal WDM are all high, the second mode selection unit 232 responsively generates a high second control signal enable signal WDM_EN. When the second I/O option signal MOD2 indicates that the semiconductor memory device is in the X4 I/O option mode and is enabled, the second control signal enable signal WDM_EN cannot be enabled.

The second control signal generation unit 230 includes a third mode determination unit 233 and a third mode selection unit 234. The third mode determination unit 233 receives the second I/O option signal MOD2 and the second control signal enable signal WDM_EN as inputs and responsively generates the third mode determination signal MOD3_DEC as an output. When the second I/O option signal MOD2 indicates that the semiconductor memory device is in the X4 I/O option mode and is enabled, the third mode determination unit 233 generates a low third mode determination signal MOD3_DEC as an output because the second control signal enable signal WDM_EN is disabled. When the second I/O option signal MOD2 indicates that the semiconductor memory device is in the X4 I/O option mode and is disabled, the state of the third mode determination signal MOD3_DEC generated by the third mode determination unit 233 is determined by the state of the second control signal enable signal WDM_EN. In such a case, the activation of the WDBI control function is based on the state of the second control signal enable signal WDM_EN.

The third mode selection unit 234 receives the first mode determination signal MOD1_DEC, the third mode determination signal MOD3_DEC, and the third mode signal WDBI as inputs and responsively generates the third control signal enable signal WDBI_EN. When the first mode determination signal MOD1_DEC, the third mode determination signal MOD3_DEC, and the third mode signal WDBI are all high, the third mode selection unit 234 responsively generates a high or enabled third control signal enable signal WDBI_EN. When the first I/O option signal MOD1 indicates that the semiconductor memory device is in the X8 I/O option mode, the WDBI control function cannot be activated when the TDQS control function is activated. Furthermore, when the second I/O option signal MOD2 indicates that the semiconductor device is in the X4 I/O option mode, the third control signal enable signal WDBI_EN may be disabled.

The second control signal generation unit 230 includes a fourth mode selection unit 235. The fourth mode selection unit 235 receives the first mode determination signal MOD1_DEC, the second mode determination signal MOD2_DEC, and the fourth mode signal RDBI as inputs and generates a fourth control signal enable signal RDBI_EN as an output. When the first mode determination signal MOD1_DEC, the second mode determination signal MOD2_DEC, and the fourth mode signal RDBI are all high, the fourth mode selection unit 235 responsively generates an enabled fourth control signal enable signal RDBI_EN. When the first I/O option signal MOD1 indicates that the semiconductor memory device is in the X8 I/O option mode, the activation of the RDBI control function depends on whether or not the TDQS control function has been activated. When the second I/O option signal MOD2 indicates that the semiconductor is in the X4 I/O option mode, the RDBI control function is disabled.

As described above, the I/O control circuit can activate only those I/O control functions that can be supported by a specific I/O option mode using the I/O option mode signal as a control signal. I/O control functions that are not supported by a particular I/O option mode can be prevented from inadvertently operating in the semiconductor memory device. Preventing the inadvertent operation of an I/O control function that is not supported by a particular I/O option mode may reduce current consumption.

Figure 3:
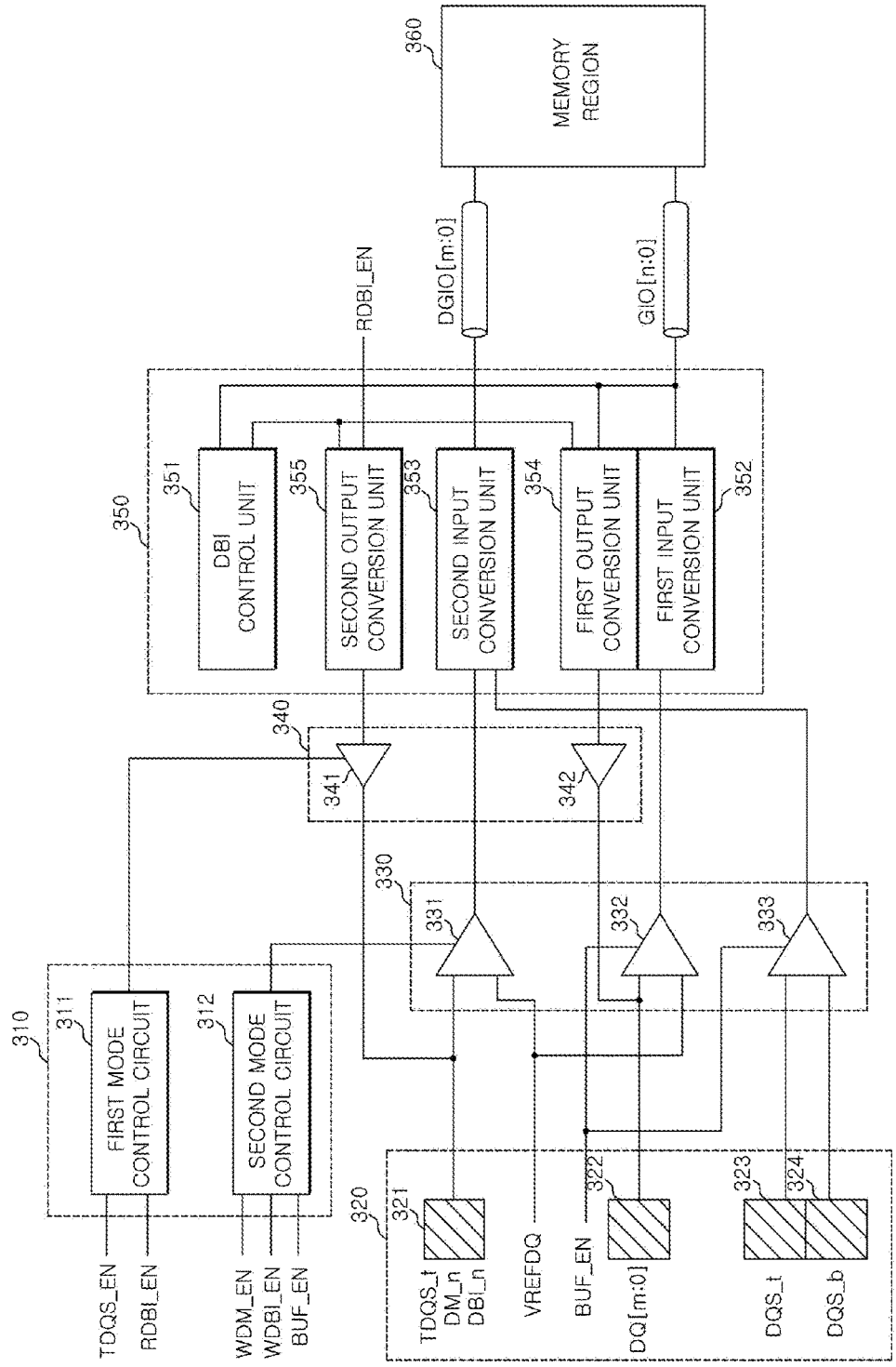
FIG. 3 shows the construction of an embodiment of a semiconductor memory device.

FIG. 3 shows the construction of an embodiment of a semiconductor memory device.

The semiconductor memory device 300 of FIG. 3 may include a mode control unit 310, a pad unit 320, an input driving unit 330, an output driving unit 340, an I/O conversion unit 350, and a memory region 360.

The mode control unit 310 receives the first control signal enable signal TDQS_EN, the second control signal enable signal WDM_EN, the third control signal enable signal WDBI_EN, the fourth control signal enable signal RDBI_EN and a buffer enable signal BUF_EN as inputs. The first control signal enable signal TDQS_EN, the second control signal enable signal WDM_EN, the third control signal enable signal WDBI_EN, and the fourth control signal enable signal RDBI_EN may be generated, for example, by the I/O control circuit shown in FIG. 1 or by the I/O control circuit shown in FIG. 2.

The mode control unit 310 may include, for example, a first mode control circuit 311 and a second mode control circuit 312. Examples of the first mode control circuit 311 and the second mode control circuit 312 are shown in FIG. 4 and FIG. 5, respectively.

Figure 4:
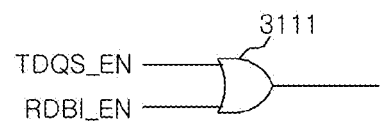
FIG. 4 is a diagram of an example of the first mode control circuit shown in FIG. 3.

FIG. 4 is a diagram of an example of the first mode control circuit 311 shown in FIG. 3. The first mode control circuit 311 may include a first logic element 3111. The first logic element 3111 receives the first control signal enable signal TDQS_EN and the fourth control signal enable signal WDBI_EN as inputs. When both the first control signal enable signal TDQS_EN and the fourth control signal enable signal WDBI_EN are low, the first logic element 3111 generates a deactivating output signal.

Figure 5:
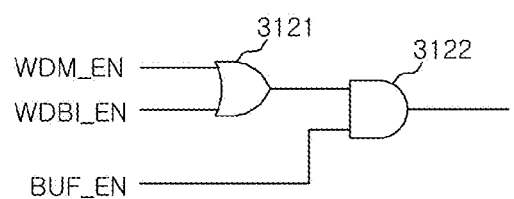
FIG. 5 is a diagram of an example of the second mode control circuit shown in FIG. 3.

FIG. 5 is a diagram of an example of the second mode control circuit 312 shown in FIG. 3.

The second mode control circuit 312 may include a second logic element 3121. The second logic element 3121 receives the second control signal enable signal WDM_EN and the third control signal enable signal WDBI_EN as inputs. When both the second control signal enable signal WDM_EN and the third control signal enable signal WDBI_EN are low, the second logic element 3121 generates a deactivating output signal. The second mode control circuit 312 may include a third logic element 3122. The third logic element 3122 receives the output signal of the second logic element 3121 and the buffer enable signal BUF_EN as inputs. When both the output signal of the second logic element 3121 and the buffer enable signal BUF_EN are high, the third logic element 3122 generates an activating output signal.

The first mode control circuit 311 generates an enabled output signal when at least one of the TDQS control function and the RDBI control function is activated. The second mode control circuit 312 generates an enabled output signal when the buffer enable signal BUF_EN is enabled and at least one of the WDM control function and the WDBI control function has been activated.

Referring back to FIG. 3, the pad unit 320 may include an I/O mode control pad 321, a data I/O pad 322, and data I/O strobe pads 323, 324. A TDQS signal TDQS for a TDQS control function, a data masking signal DM_n, or a DBI signal DBI_n is received at the I/O mode control pad 321. Write data DQ[m:0] is provided to the data I/O pad 322 by an external device or read data DQ[m:0] is provided by the memory region 360 to the data I/O pad 322. Strobe signals DQS_t and DQS_b for the synchronization of data I/O operations are provided to the data I/O strobe pads 323, 324.

The input driving unit 330 may include a first buffer 331, a second buffer 332, and a third buffer 333.

The first buffer 331 is configured to be driven in response to an output signal of the second mode control circuit 312 and to forward to the I/O conversion unit 350 the signal applied to the I/O mode control pad 321 in response to a pad reference signal VREFDQ. In other words, when the WDM control function or the WDBI control function is activated, the first buffer 331 supplies the I/O conversion unit 350 with the data masking signal DM_n or the DBI signal DBI_n, such that a data write operation is performed in accordance with either the data masking signal DM_n or the DBI signal DBI_n.

The second buffer 332 is configured to be driven in response to a buffer enable signal BUF_EN and to forward to the I/O conversion unit 350 data received via the data I/O pad 322 in response to the pad reference signal VREFDQ.

The third buffer 333 is configured to be driven in response to the buffer enable signal BUF_EN and to forward to the I/O conversion unit 350 the strobe signals DQS_t, DQS_b received via the data I/O strobe pads 323, 324.

The output driving unit 340 may include a fourth buffer 341 and a fifth buffer 340.

The fourth buffer 341 may be configured to be driven in response to an output signal of the first mode control circuit 311 and to forward to the I/O mode control pad 321 read control data received from the I/O conversion unit 350. For example, the read control data may be data used to restore data when an RDBI control function is performed.

The fifth buffer 342 receives read data from the I/O conversion unit 350 and forwards the received read data to the data I/O pad 322.

The I/O conversion unit 350 may include a DBI control unit 351, a first input conversion unit 352, a second input conversion unit 353, a first output conversion unit 354, and a second output conversion unit 355.

The DBI control unit 351 performs data conversion when a write or read operation is performed in DBI mode.

The first input conversion unit 352 receives the write data received at the data I/O pad 322 and the strobe signals received at the data I/O strobe pads 323, 324 via the input driving unit 330. The first input conversion unit 352 supplies the received write data and strobe signals to the memory region 360 via first global I/O lines GIO[n:0]. The second input conversion unit 353 receives the signals received at the I/O mode control pad 321 and the strobe signals received at the data I/O strobe pads 323, 324 via the input driving unit 330 and forwards the received signals and the strobe signals to the memory region 360 via second global I/O lines DGIO[m:0]. When the WDM control function or the WDBI control function is activated, the write data may be subject to masking processing or inversion processing, synchronized with the strobe signals, and stored in memory cells within the memory region 360.

When the WDBI control function is activated, the write data may be converted by the DBI control unit 351 and provided to the memory region 360 via the first global I/O lines GIO[n:0].

The first output conversion unit 354 receives data read from the memory region 360 via the first global I/O lines GIO[n:0] and provides the received data to the data I/O pad 322 via the output driving unit 340. When the RDBI control function is activated, the second output conversion unit 355 provides read data to the DBI control unit 351 for conversion in response to a fourth control signal enable signal RDBI_EN. Furthermore, when the RDBI control function is performed, the second output conversion unit 355 may provide read control data used to restore the RDBI control function to the I/O mode control pad 321 via the output driving unit 340.

In an embodiment, the first and the second input conversion units 352 and 353 may convert serial input data into parallel data and provide the parallel data to the memory region 360. In such a case, the first and the second output conversion units 354, 355 may convert parallel data received from the memory region 360 into serial data and provide the serial data to the output driving unit 340.

The I/O control circuit of FIG. 1 or FIG. 2 can generate the first control signal enable signal TDQS_EN, the second control signal enable signal WDM_EN, the third control signal enable signal WDBI_EN and the fourth control signal enable signal RDBI_EN in accordance with an I/O option mode. Furthermore, a relatively more precise operation can be performed in each I/O option mode because the mode control unit 310 of FIG. 3 controls the input driving unit 330 and the output driving unit 340.

Figure 6:
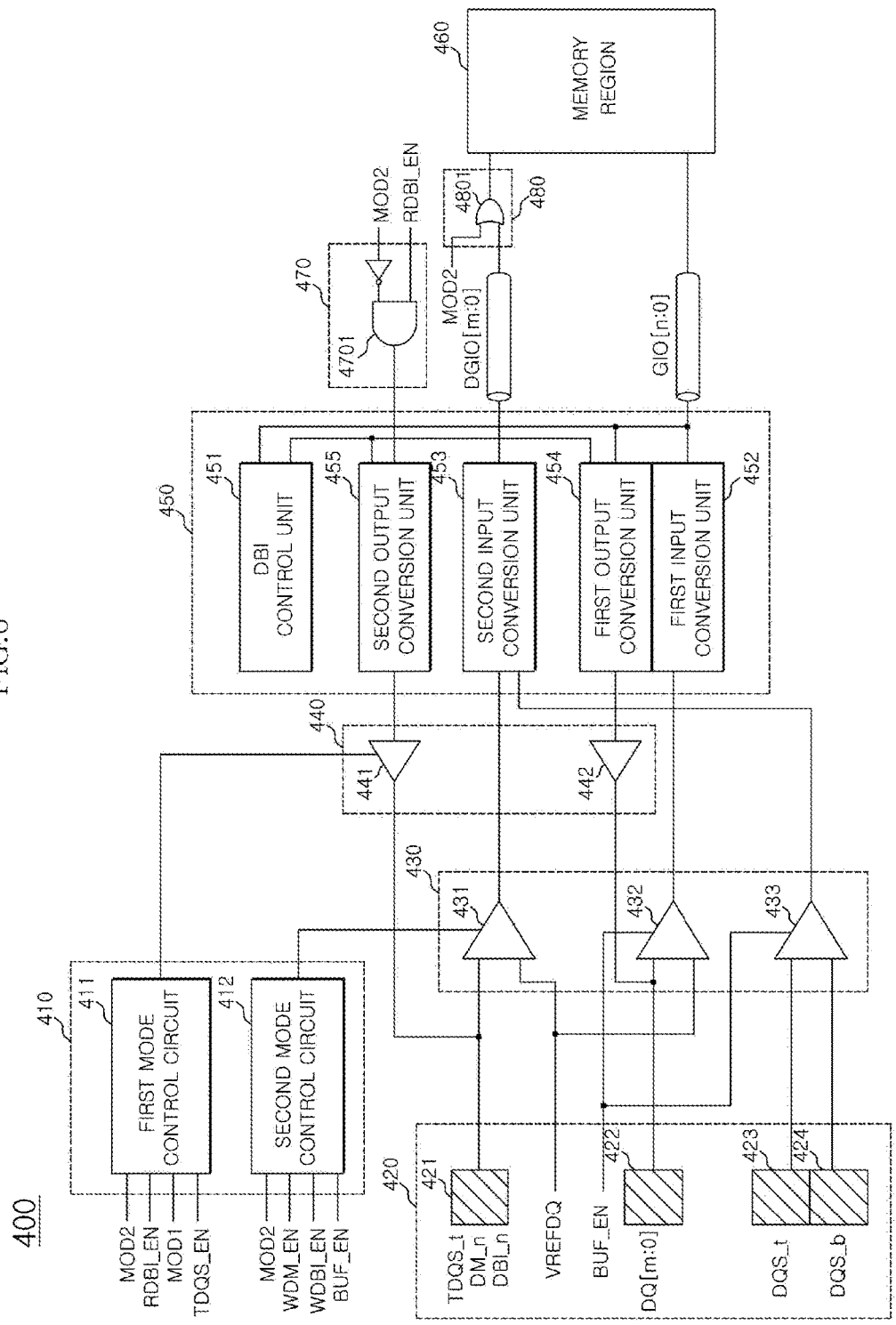
FIG. 6 shows the construction of an embodiment of a semiconductor memory device.

FIG. 6 shows the construction of an embodiment of a semiconductor memory device.

The semiconductor memory device 400 of FIG. 6 may include a first mode control unit 410, a pad unit 420, an input driving unit 430, an output driving unit 440, an I/O conversion unit 450, a memory region 460, a second mode control unit 470, and a third mode control unit 480. In the semiconductor memory device 400 in FIG. 6, the pad unit 420, the input driving unit 430, the output driving unit 440, the I/O conversion unit 450, and the memory region 460 have substantially the same construction as the pad unit 320, the input driving unit 330, the output driving unit 340, the I/O conversion unit 350, and the memory region 360 described with respect to the semiconductor memory device 300 shown in FIG. 3. Accordingly, only the first mode control unit 410, the second mode control unit 470 and the third mode control unit 480 are described below.

An embodiment of the first mode control unit 410 receives a first I/O option signal MOD1, a second I/O option signal MOD2, the first control signal enable signal TDQS_EN, the second control signal enable signal WDM_EN, the third control signal enable signal WDBI_EN, the fourth control signal enable signal RDBI_EN and the buffer enable signal BUF_EN. The first, second, third and fourth control signal enable signals TDQS_EN, WDM_EN, WDBI_EN, RDBI_EN may be generated by the I/O control circuit shown, for example, in FIG. 1 or FIG. 2.

The first mode control unit 410 includes a first mode control circuit 411 and a second mode control circuit 412. A diagram of an example of the first mode control circuit 411 is shown in FIG. 7, and a diagram of an example of the second mode control circuit 412 is shown in FIG. 8.

The first mode control circuit 411 is configured to activate an associated output signal based on the activation state of the fourth control signal enable signal RDBI_EN when the second I/O option signal MOD2 is disabled and to activate the associated output signal based on the activation state of the first control signal enable signal TDQS_EN when the first I/O option signal MOD2 is enabled.

The second mode control circuit 412 configured to activate an associated output signal when the second I/O option signal MOD2 is disabled if one of the second control signal enable signal WDM_EN and the third control signal enable signal WDBI_EN is activated and the buffer enable signal BUF_EN is activated.

Figure 7:
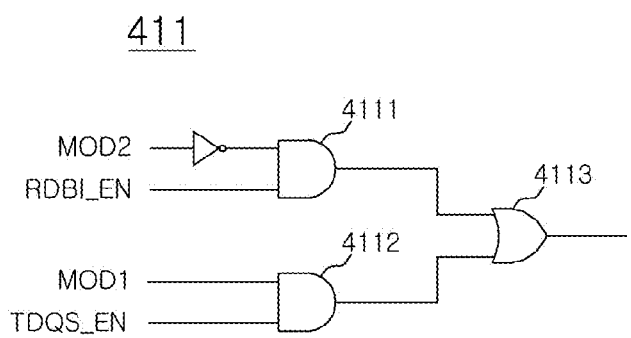
FIG. 7 is a diagram of an example of the first mode control circuit shown in FIG. 6.
Figure 8:
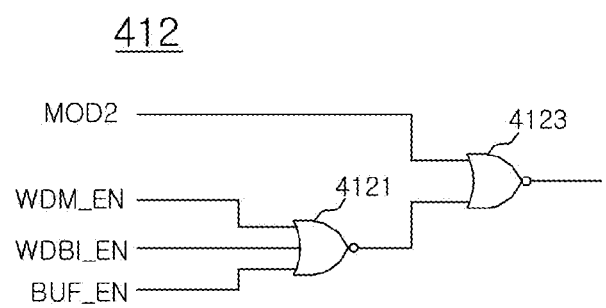
FIG. 8 is a diagram of an example of the second mode control circuit shown in FIG. 6.

As shown in FIG. 7, the first mode control circuit 411 may include a first logic element 4111, a second logic element 4112 and a third logic element 4113. The first logic element 4111 receives an inverted second I/O option signal MOD2 and the fourth control signal enable signal RDBI_EN as inputs. When both the inverted second I/O option signal MOD2 and the fourth control signal enable signal RDBI_EN are high, the first logic element 4111 generates a high output signal. The second logic element 4112 receives the first I/O option signal MOD1 and the first control signal enable signal TDQS_EN as inputs. When both the first I/O option signal MOD1 and the first control signal enable signal TDQS_EN are high, the second logic element 4112 generates a high output signal. The third logic element 4113 receives the output signals of the first logic element 4111 and the second logic element 4112 as inputs. When the output signals received from the first logic element 4111 and the second logic element 4112 are both low, the third logic element 4113 responsively generates a deactivating output signal.

The first logic element 4111 supports the RDBI control function when an I/O option mode is not the X4 I/O option mode. The second logic element 4112 supports the TDQS control function only when an I/O option mode is the X8 I/O option mode. Accordingly, the third logic element 4113 enables the output signal when the TDQS control function is activated if an I/O option mode is the X8 I/O option mode and when the RDBI control function is activated if an I/O option mode is not the X4 I/O option mode.

As shown in FIG. 8, the second mode control circuit 412 may include a fourth logic element 4121 and a fifth logic element 4123. The fourth logic element 4121 receives the second control signal enable signal WDM_EN, the third control signal enable signal WDBI_EN, and the buffer enable signal BUF_EN as inputs. When at least one of the second control signal enable signal WDM_EN, the third control signal enable signal WDBI_EN, and the buffer enable signal BUF_EN is high, the fourth logic element 4121 responsively generates a low output signal. The fifth logic element 4122 receives the output signal from the fourth logic element 4121 and the second I/O option signal MOD2 as inputs. When both the output signal and the second I/O option signal MOD2 are low, the fifth logic element 4122 responsively generates a high output signal.

The fourth logic element 4121 outputs a low output signal when the buffer enable signal BUF_EN is enabled and at least one of the WDM control function and the WDBI control function has been activated. The fifth logic element 4122 generates an enabled output signal when at least one of the WDM control function and the WDBI control function is activated and the I/O option mode is not the X4 I/O option mode.

Referring back to FIG. 6, the second mode control unit is configured to activate the fourth control signal enable signal RDBI_EN when the second I/O option signal MOD2 is disabled and provide the activated fourth control signal enable signal RDBI_EN to the I/O conversion unit 450. The second mode control unit 470 may include a sixth logic element 4701. The six logic element 4701 receives an inverted second I/O option signal MOD2 and the fourth control signal enable signal RDBI_EN as inputs. When both the inverted second I/O option signal MOD2 and the fourth control signal enable signal RDBI_EN are high, the sixth logic element responsively generates an activating output signal. In other words, the second mode control unit 470 generates an activated fourth control signal enable signal RDBI_EN if an I/O option mode is not the X4 I/O option mode.

The third mode control unit 480 is configured to provide the memory region 460 with data from the I/O conversion unit 450 when the second I/O option signal MOD2 is disabled. The third mode control unit 480 may include a seventh logic element 4801. The seventh logic element 4801 receives the second I/O option signal MOD2 and a signal applied to the second global I/O lines DGIO[m:0] as inputs. When at least one of the second I/O option signal MOD2 and the signal applied to the second global I/O lines DGIO[m:0] is high, the seventh logic element 4801 responsively generates an activating output signal. If an I/O option mode is not the X4 I/O option mode, the third mode control unit 480 may treat the signal applied to the second global I/O lines DGIO[m:0] as being valid.

An embodiment of the semiconductor memory device 400 can be controlled in response to the first, second, third, and fourth control signal enable signals TDQS_EN, WDM_EN, WDBI_EN, RDBI_EN generated using the first I/O option signal MOD1 and the second I/O option signal MOD2. Furthermore, the input driving unit 430, the output driving unit 440, the second input conversion unit 454, and the second output conversion unit 455 can be controlled using the first I/O option signal MOD1 and the second I/O option signal MOD2. Accordingly, an I/O control operation may be performed in a relatively more precise manner because an I/O option mode for the semiconductor memory device 400 is set.

Figure 9:
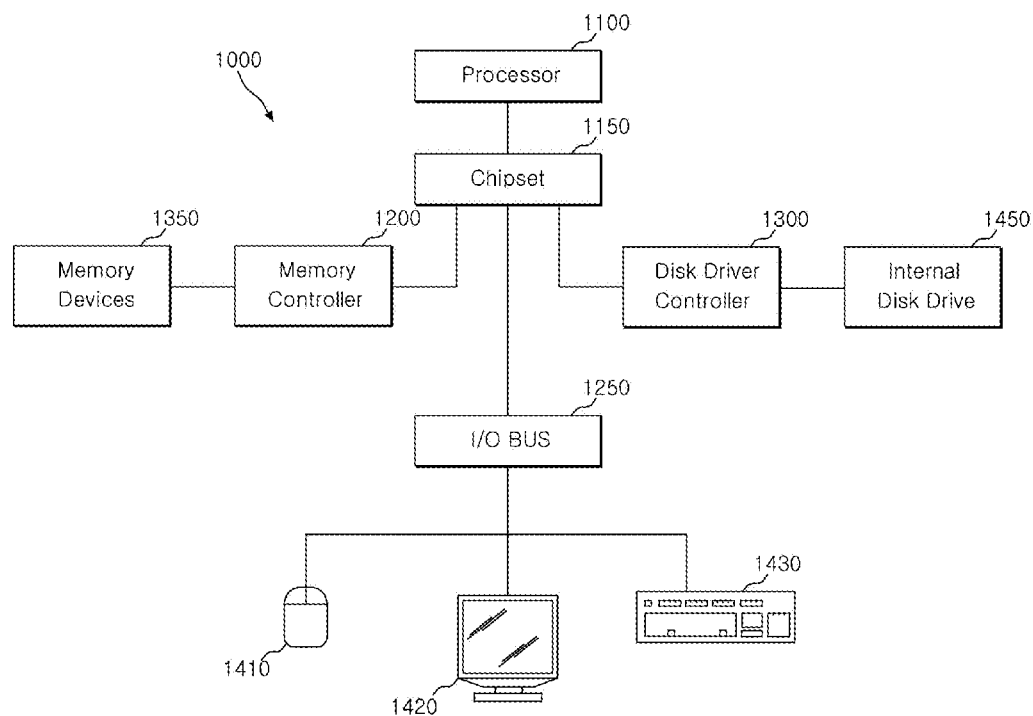
FIG. 9 is a block diagram representation of a system including an embodiment of a semiconductor memory device and an embodiment of an I/O control circuit.

Referring to FIG. 9, a block diagram representation of a system 1000 including an embodiment of a semiconductor memory device 1350 and an embodiment of an I/O control circuit is shown. The system 1000 includes one or more semiconductor memory devices 1350 and a memory controller 1200. In an embodiment, the I/O control circuit is disposed in a memory controller 1200. In an embodiment, the I/O control circuit is disposed in a semiconductor memory device 1350.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using any type of communication protocol, including all of those mentioned above with regard to the I/O bus 1250.

The system 1000 described above in relation to FIG. 9 is merely one example of a system employing a semiconductor memory device 1350 and I/O control circuit. In alternate embodiments, such as cellular phones or digital cameras, the components may differ from the embodiment shown in FIG. 9.

While certain embodiments have been described above, it will be understood to those skilled in the art that the embodiments described are by way of example only. Accordingly, the semiconductor memory device and the I/O control circuit described herein should not be limited based on the described embodiments. Rather, the device described herein should only be limited in light of the claims that follow when taken in conjunction with the above description and accompanying drawings.

What is claimed is:

1. A semiconductor memory device, comprising:
    a mode control unit configured to generate an output signal in response to a first control signal enable signal, a second control signal enable signal, a third control signal enable signal, a fourth control signal enable signal, and a buffer enable signal received from an I/O control circuit;
    a pad unit comprising an I/O mode control pad, a data I/O pad, and a data I/O strobe pad;
    an input driving unit configured to be driven in response to the output signal of the mode control unit and electrically coupled to the pad unit;
    an output driving unit configured to be driven in response to the output signal of the mode control unit and electrically coupled to the pad unit; and
    an I/O conversion unit configured to provide a memory region with data received from the input driving unit and to provide the output driving unit with data received from the memory region in response to the fourth control signal enable signal.

2. The semiconductor memory device of claim 1, wherein the I/O control circuit comprises:
    a mode setting unit configured to generate a first mode signal, a second mode signal, a third mode signal, and a fourth mode signal in accordance with one of a plurality of I/O option modes;
    a first control signal generation unit configured to generate a first mode determination signal and a first control signal enable signal in response to the first I/O option signal and the first mode signal; and
    a second control signal generation unit configured to generate a second control signal enable signal, a third control signal enable signal, and a fourth control signal enable signal in response to a second I/O option signal, the first mode determination signal, the second mode signal, the third mode signal, and the fourth mode signal.

3. The semiconductor memory device of claim 2, wherein:
    the first control signal enable signal is a termination data strobe (TDQS) signal enable signal,
    the second control signal enable signal is a data mask (WDM) signal enable signal,
    the third control signal enable signal is a data bus inversion (WDBI) signal enable signal in write mode, and
    the fourth control signal enable signal is a data bus inversion (RDBI) signal enable signal in read mode.

4. The semiconductor memory device of claim 1, wherein the mode control unit comprises:
    a first mode control circuit configured to activate an associated output signal when one of the first control signal enable signal and the fourth control signal enable signal is activated; and
    a second mode control circuit configured to activate an associated output signal when one of the second control signal enable signal and the third control signal enable signal is activated and when the buffer enable signal is activated.

5. The semiconductor memory device of claim 1, wherein the I/O mode control pad receives one of a termination data strobe (TDQS) signal, a data masking signal, and a data bus inversion (DBI) signal.

6. A semiconductor memory device, comprising:
    a first mode control unit configured to generate an output signal in response to a first control signal enable signal, a second control signal enable signal, a third control signal enable signal, a fourth control signal enable signal, a buffer enable signal, a first I/O option signal, and a second I/O option signal received from an I/O control circuit;
    a pad unit comprising an I/O mode control pad, a data I/O pad, and a data I/O strobe pad;

an input driving unit configured to be driven in response to the output signal of the first mode control unit and electrically coupled to the pad unit;

an output driving unit configured to be driven in response to the output signal of the first mode control unit and electrically coupled to the pad unit; and an I/O conversion unit configured to provide a memory region with data received from the input driving unit and to provide the output driving unit with data received from the memory region in response to a fourth control signal enable signal.

7. The semiconductor memory device of claim 6, wherein the I/O control circuit comprises:

a mode setting unit configured to generate a first mode signal, a second mode signal, a third mode signal, and a fourth mode signal in accordance with one of a plurality of I/O option modes;

a first control signal generation unit configured to generate a first mode determination signal and a first control signal enable signal in response to the first I/O option signal and the first mode signal; and a second control signal generation unit configured to generate a second control signal enable signal, a third control signal enable signal, and a fourth control signal enable signal in response to a second I/O option signal, the first mode determination signal, the second mode signal, the third mode signal, and the fourth mode signal.

8. The semiconductor memory device of claim 7, wherein the first I/O option signal and the second I/O option signal determine an I/O option mode associated with a data I/O bandwidth.

9. The semiconductor memory device of claim 7, wherein:

the first control signal enable signal is a termination data strobe (TDQS) signal enable signal, the second control signal enable signal is a data mask (WDM) signal enable signal, the third control signal enable signal is a data bus inversion (WDBI) signal enable signal in write mode, and the fourth control signal enable signal is a data bus inversion (RDBI) signal enable signal in read mode.

10. The semiconductor memory device of claim 6, wherein the first mode control unit comprises:

a first mode control circuit configured to activate an associated output signal based on the activation state of the fourth control signal enable signal when the second I/O option signal is disabled and to activate the associated output signal based on the activation state of the first control signal enable signal when the first I/O option signal is enabled; and a second mode control circuit configured to activate an associated output signal when the second I/O option signal is disabled if one of the second control signal enable signal and the third control signal enable signal is activated and the buffer enable signal is activated.

11. The semiconductor memory device of claim 6, further comprising a second mode control unit configured to activate the fourth control signal enable signal when the second I/O option signal is disabled and provide the activated fourth control signal enable signal to the I/O conversion unit.

* * * * *